US008526195B2

(12) United States Patent
Hublier et al.

(10) Patent No.: US 8,526,195 B2

(45) Date of Patent: Sep. 3, 2013

(54) ELECTRICAL CONNECTION TERMINAL

(75) Inventors: Philippe Hublier, Angers (FR); Fabrice Hamon, Saint Lambert du Lattay (FR)

(73) Assignee: ELDRE, Saint Sylvain d'Anjou (FR)

( * ) Notice: Subject to any disclaimer, the term of this patent is extended or adjusted under 35 U.S.C. 154(b) by 378 days.

(21) Appl. No.: 12/734,176

(22) PCT Filed: Oct. 14, 2008

(86) PCT No.: PCT/EP2008/063805

§ 371 (c)(1),
(2), (4) Date: Apr. 15, 2010

(87) PCT Pub. No.: WO2009/050170

PCT Pub. Date: Apr. 23, 2009

(65) Prior Publication Data

US 2010/0243322 A1 Sep. 30, 2010

(30) Foreign Application Priority Data

Oct. 15, 2007 (FR) ..................................... 07 07214

(51) Int. Cl.
*H05K 7/02* (2006.01)

(52) U.S. Cl.
USPC ........... 361/807; 361/742; 361/758; 361/770; 361/804; 174/50; 439/66

(58) Field of Classification Search
USPC ................... 174/50; 361/742, 758, 770, 804, 361/807; 439/66
See application file for complete search history.

(56) References Cited

U.S. PATENT DOCUMENTS

| | | | | |
|---|---|---|---|---|
| 3,124,408 | A | 3/1964 | Oestereicher | |
| 4,640,639 | A * | 2/1987 | Matsui | 403/24 |
| 4,842,437 | A * | 6/1989 | Egner | 403/24 |

(Continued)

FOREIGN PATENT DOCUMENTS

| | | |
|---|---|---|
| DE | 1400824 | 10/1968 |
| EP | 0945919 A1 * | 9/1999 |

(Continued)

OTHER PUBLICATIONS

Preliminary Examination Report on Patentability for PCT/EP2008/063805, International Bureau de l'Ompi, Geneva, Switzerland, May 11, 2010, 9 pages.

(Continued)

*Primary Examiner* — Chau N Nguyen
*Assistant Examiner* — Kevin Ahlstrom
(74) *Attorney, Agent, or Firm* — Faegre Baker Daniels LLP

(57) ABSTRACT

The disclosure concerns an electrical connection assembly comprising: a conductive plate with a drillhole, a first column with a hole passing axially through it and comprising a shoulder to abut against one of the faces of the conductive plate, and a second column with a hole passing axially through it and comprising a shoulder to abut against the other face of the conductive plate, a first cylinder with a radius sized to enable it to enter the hole in the first column and a length sized such that, when the shoulder is in abutment, the free end of the first cylinder projects beyond the conductive plate, and a second cylinder with a radius sized to enable it to enter the drillhole, wherein the free end of the first cylinder is crimped by radial expansion and then by axial compression in the hole in the first column.

4 Claims, 4 Drawing Sheets

(56) References Cited

U.S. PATENT DOCUMENTS

| | | | | | |
|---|---|---|---|---|---|
| 5,239,135 | A * | 8/1993 | Phillips, II | .................... | 174/267 |
| 5,563,770 | A * | 10/1996 | Bethurum | ..................... | 361/737 |
| 6,377,445 | B1 * | 4/2002 | Davis et al. | ................... | 361/752 |
| 6,493,233 | B1 * | 12/2002 | De Lorenzo et al. | ......... | 361/752 |
| 6,560,119 | B1 * | 5/2003 | Katsuyama et al. | .......... | 361/752 |
| 7,052,291 | B2 * | 5/2006 | Barina et al. | .................... | 439/92 |
| 7,349,222 | B2 * | 3/2008 | Kim | .............................. | 361/758 |
| 7,593,239 | B2 * | 9/2009 | Li et al. | ......................... | 361/807 |
| 2003/0058627 | A1 * | 3/2003 | Paquin et al. | ................. | 361/758 |
| 2006/0285306 | A1 * | 12/2006 | Carnevali | ...................... | 361/758 |

FOREIGN PATENT DOCUMENTS

| | | | |
|---|---|---|---|
| EP | 1779964 | A1 | 2/2007 |
| GB | 2154079 | A | 8/1985 |
| JP | 45-17107 | B | 6/1970 |
| JP | 57-17574 | A | 1/1982 |
| JP | 2004-39256 | A | 2/2004 |
| JP | 3119704 | U | 2/2006 |
| JP | 2007-19372 | A | 1/2007 |

OTHER PUBLICATIONS

European Patent Office—International Searching Authority, International Search Report and Written Opinion for PCT/EP2008/063805, Jan. 28, 2009, 12 pages, Munich.

* cited by examiner

ELECTRICAL CONNECTION TERMINAL

CROSS REFERENCE TO RELATED APPLICATION

This application claims priority from International Patent Application No. PCT/EP2008/063805, filed Oct. 14, 2008, which claims priority from French patent Application No. 07/07214, filed Oct. 15, 2007 by the same inventors hereto, the disclosures of which are expressly incorporated herein by reference.

FIELD

The present disclosure concerns an electrical connection assembly and a tool provided for producing such an assembly.

BACKGROUND AND SUMMARY

In an electrical box, an electrically conductive plate serving as an electrical conductor makes it possible to connect together various electronic power components, for example a cable, a circuit breaker or the like. Because of the length of the conductive plate and the manufacturing tolerances of the surrounding elements, certain electrical components are situated at a certain distance from the conductive plate and are not in contact with it.

The document GB-A-2 154 079 shows a connection assembly of the prior art.

One feature of the present disclosure is an electrical connection assembly that enables the conductive plate and electrical components to be put in contact.

According to one embodiment of the disclosure, an electrical connection assembly is proposed comprising:

a conductive plate with a drillhole in it, a first small column with a hole passing axially through it and comprising a shoulder intended to come into abutment against one of the faces of the conductive plate, and a second small column with a hole passing axially through it and comprising a shoulder intended to come into abutment against the other face of the conductive plate, a first cylinder the radius of which is adapted to enable it to enter the hole in the first small column and the length of which is such that, when the shoulder is in abutment, the free end of the first cylinder projects beyond the conductive plate, and a second cylinder the radius of which is adapted to enable it to enter the drillhole, the connection assembly being characterised in that the free end of the first cylinder is crimped by radial expansion and then by axial compression in the hole in the first small column.

The hole in the first small column is bevelled on the crimping side.

According to another embodiment, the first small column comprises a hollow cylinder the radius of which is adapted to enable it to enter the drillhole.

The lengths of the hollow cylinder and second cylinder are such that, when the shoulder of the first small column and the shoulder of the second small column are in abutment against the conductive plate, the hollow cylinder and the second cylinder are in abutment against each other.

According to yet another embodiment, the length of the second cylinder is greater than the thickness of the conductive plate and the shoulder of the first column has a hole passing axially through it, the radius of which is adapted to enable it to be fitted on the second cylinder.

The disclosure also proposes a tool comprising a first part comprising a body in which a hollow recess is hollowed out and a second part comprising a body on which a punch is produced designed to enter the hollow recess, the tool being characterised in that the punch is fixed to the body by means of a grooved zone.

BRIEF DESCRIPTION OF THE DRAWINGS

The features of the disclosure mentioned above, as well as others, will appear more clearly from a reading of the following description of an example embodiment, the said description being given in relation to the accompanying drawings, among which.

DETAILED DESCRIPTION OF THE DRAWINGS

Figure 1A:
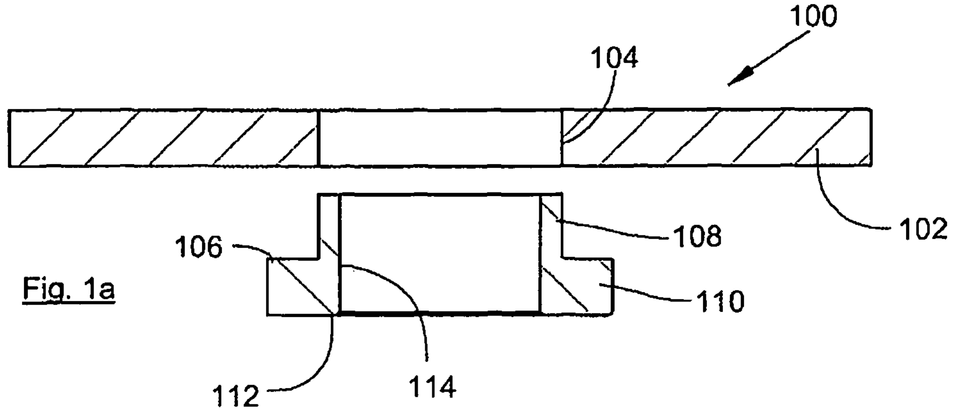
FIG. 1*a-c* show steps of assembly of an electrical connection assembly according to a first embodiment of the disclosure.

FIG. 1*a* shows an electrical connection assembly 100 comprising an electrically conductive plate 102 and at least one small column 106 that are not assembled.

The connection assembly 100 is intended to be installed in an electrical box. The conductive plate 102 is fixed in the electrical box and electrical components are fitted in the electrical box so as to come into contact with the conductive plate 102 or one of the small columns 106 according to the distance between the electrical component and the conductive plate 102. That is to say if, after installation of the electrical component, the latter is in contact with the conductive plate 102, a small column 106 is not provided but if, after installation of the electrical component, the latter is not in contact with the conductive plate 102, a small column 106 is provided.

Figure 1B:
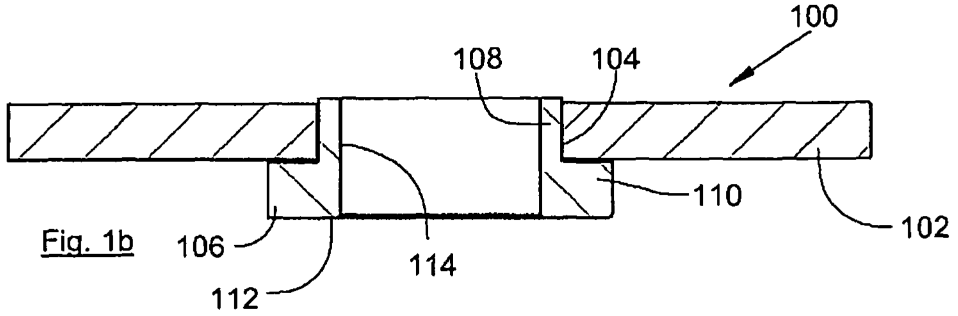

The conductive plate 102 has in it a drillhole 104 intended to receive the small column 106. For this purpose, the small column 106 comprises a cylinder 108, the radius of which is adapted to enable it to enter the drillhole 104 (FIG. 1*b*). The small column 106 is hollow and has a hole 114 passing axially through it.

A shoulder 110 on the small column 106 stops the small column 106 in abutment against the conductive plate 102. The length of the cylinder 108 is such that, when the shoulder 110 is in abutment, the free end of the cylinder 108 projects beyond the conductive plate 102.

Figure 1C:
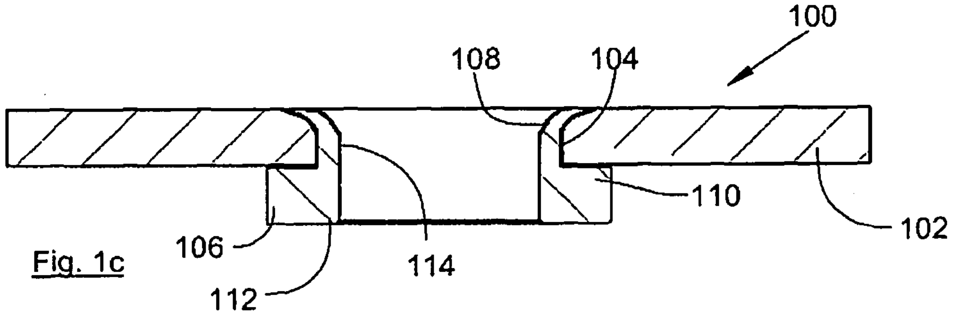

FIG. 1*c* shows the connection assembly 100 after crimping of the small column 106 on the conductive plate 102. The crimping takes place by radial expansion of the free end of the cylinder 108 of the small column 106 and then by axial compression thereof. After the axial compression, the crimped end of the small column 106 is flush with the conductive plate 102.

A tool, described below, is introduced into the hole 114 through the end disposed on the side opposite to the side through which the small column 106 is introduced into the drillhole 104. The tool is designed to exert a radial expansion force on the free end of the first cylinder 106 and to compress it against the face of the conductive plate 102.

Crimping is not carried out solely by axial compression with the first cylinder, but by radial expansion and then axial compression. This crimping makes it possible to obtain a small column 106 that is perfectly held and difficult to pull away, unlike a solely axial crimping.

The external face 112 of the small column 106 is then at a distance from the face of the conductive plate 102 and makes it possible to come into contact with an electrical component.

The hole 114 can serve as a fixing hole for a screw holding the electrical component.

Figure 2:
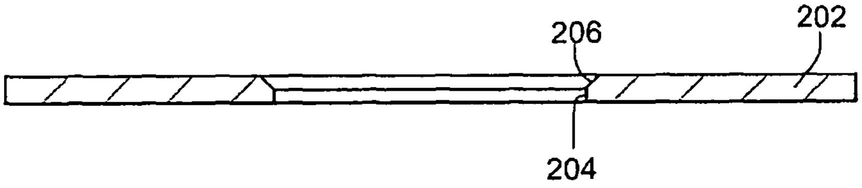
FIG. 2 shows a conductive plate according to a variant embodiment, FIGS. 3*a&b* show steps of assembling an electrical connection assembly according to a second embodiment of the disclosure, FIGS. 4*a&b* show steps of assembling an electrical connection assembly according to a third embodiment of the disclosure, and FIGS. 5*a&b* show the two parts of a tool according to the disclosure.

FIG. 2 shows a conductive plate 202 according to another embodiment, particularly adapted for thin conductive plates, for example less than 1 mm. The conductive plate 202 has a drillhole 204 that is bevelled on the crimping side. The bevel receives the radial expansion of the small column.

Figure 3A:
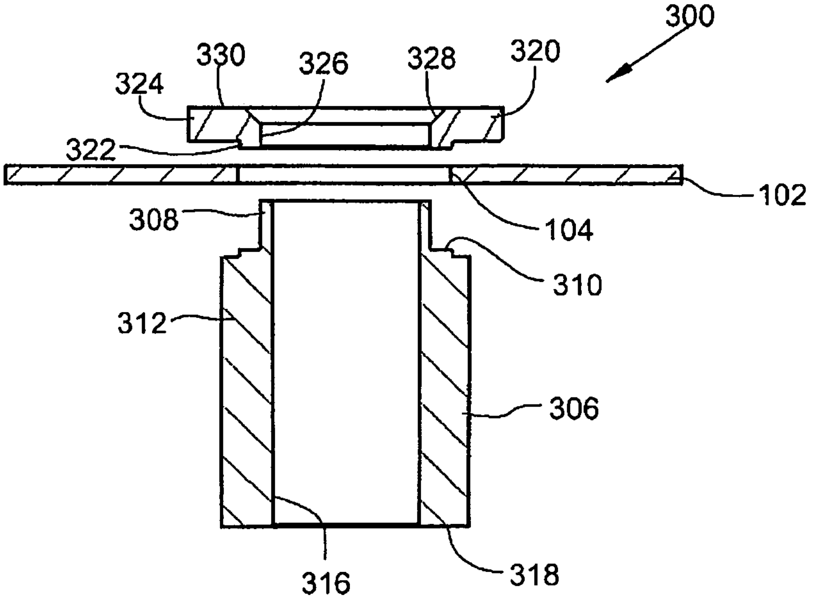
Figure 3B:
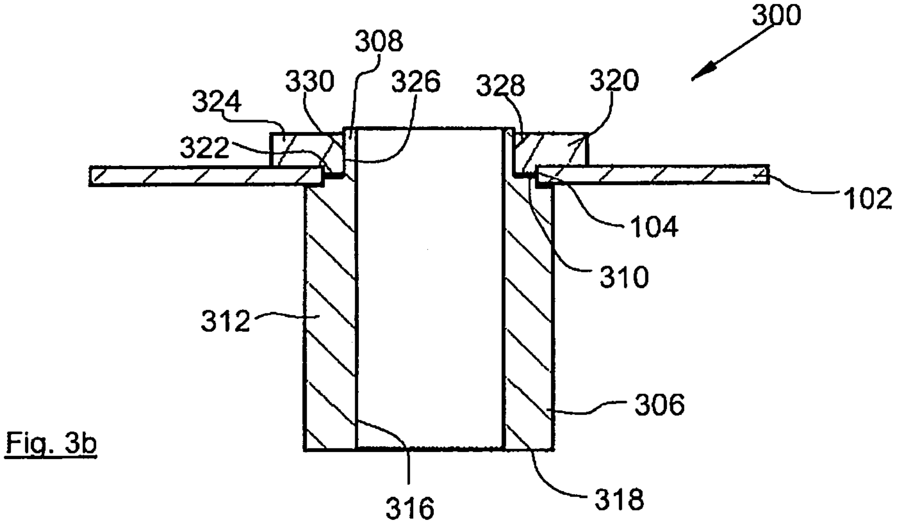

FIG. 3 shows an electrical connection assembly 300, not assembled, according to a second embodiment. FIG. 3*b* shows the connection assembly 300 assembled but not crimped.

The connection assembly 300 comprises a conductive plate 102 with a drillhole 104 and a first small column 320 coming against one of the faces of the conductive plate 102 and a second small column 306 coming against the other face of the conductive plate 102.

The first small column 320 has a hole 326 passing axially through it, which has here a bevel 328 and comprises a cylinder 322 and a shoulder 324.

The second small column has hole 316 passing axially through it and comprises successively a first cylinder 308, a second coaxial cylinder 310 and a shoulder 312 intended to stop the second small column 306 against the conductive plate 102.

The cylinder 322 of the first small column 320 has a radius adapted to enable it to enter the drillhole 104 (FIG. 3*b*). The stopping of the first small column 320 against the conductive plate 102 is effected by abutment of the shoulder 324. The length of the cylinder 322 is here less than the thickness of the conductive plate 102.

The radius of the first cylinder 308 is adapted to enable it to enter the hole 326 in the first small column 320. The radius of the second cylinder 310 is adapted to enable it to enter the drillhole 104. The lengths of the cylinder 322 of the first small column 320 and of the second cylinder 310 are such that, when the shoulder 324 on the first small column 320 and the shoulder 312 on the second small column 306 are in abutment against the conductive plate 102, the cylinder 322 and the second cylinder 310 are in abutment against each other.

The length of the first cylinder 308 is such that, when the connection assembly 300 is assembled (FIG. 3*b*), the free end of the said first cylinder 308 projects beyond the external face of the first small column 320. The second small column 306 is then crimped in the first small column 320 in accordance with the first embodiment, by radial expansion of the free end of the first cylinder 308 and then its axial compression in the bevel 328.

The connection assembly 300 thus produced makes it possible to obtain a contact on the external face 330, 318, of each small column 320, 306 in order to put an electrical component in contact on each of these faces 318, 330.

Figure 4A:
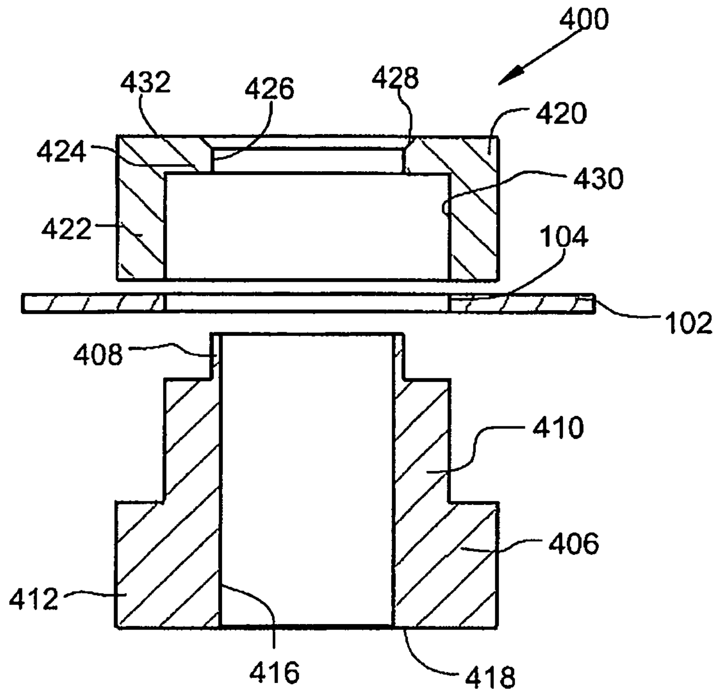
Figure 4B:
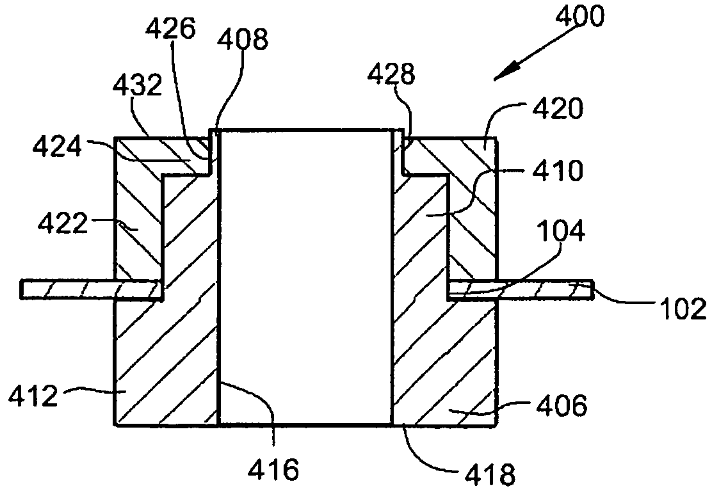

FIG. 4*a* shows an electrical connection assembly 400, not assembled, according to a third embodiment. FIG. 4*b* shows the connection assembly 400 assembled but not crimped.

The connection assembly 400 comprises a conductive plate 102 with a drillhole 104 and a first small column 420 coming against one of the face of the conductive plate 102 and a second small column 406 coming against the other face of the conductive plate 102.

The first small column 420 comprises a cylinder 424 and a shoulder 422 intended to come into abutment against the conductive plate 102. The cylinder 424 has a hole 426 passing axially through it, which here has a bevel 428. The shoulder 422 has a hole 430 passing axially through it.

The second small column 406 has a hole 416 passing axially through it and comprises successively a first cylinder 408, a coaxial second cylinder 410 and a shoulder 412 intended to stop the second small column 406 against the conductive plate 102.

The radius of the second cylinder 410 is adapted to enable it to enter the drillhole 104 (FIG. 4*b*). The length of the second cylinder 410 is greater than the thickness of the conductive plate 102.

The radius of the hole 430 in the shoulder 422 is adapted to enable the first small column 420 to be fitted on the second cylinder 410. The radius of the first cylinder 408 is adapted to enable it to enter the hole 426 in the cylinder 424 and its length is such that, when the connection assembly 400 is assembled (FIG. 4*b*), its free end projects beyond the external face of the first small column 420.

In the assembled position, the second cylinder 410 is in abutment against the cylinder 424 and the shoulders 422 and 412 are in abutment on either side of the conductive plate 102.

The second small column 406 is then crimped in the first small column 420 in accordance with the first embodiment, by radial expansion of the free end of the first cylinder 408 and then axial compression in the bevel 428.

The connection assembly 400 thus produced makes it possible to obtain a contact on the external face 432, 418 of each small column 420, 406 in order to put an electrical component in contact on each of these faces 432, 418.

Figure 5A:
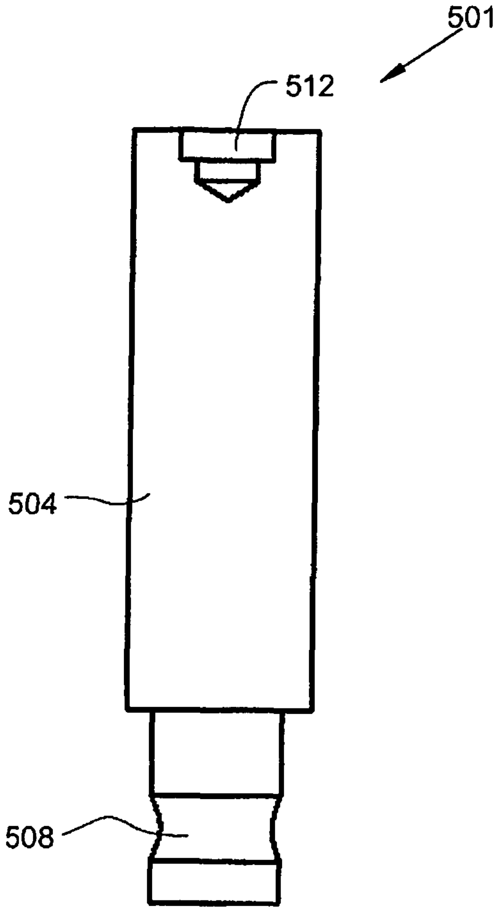
Figure 5B:
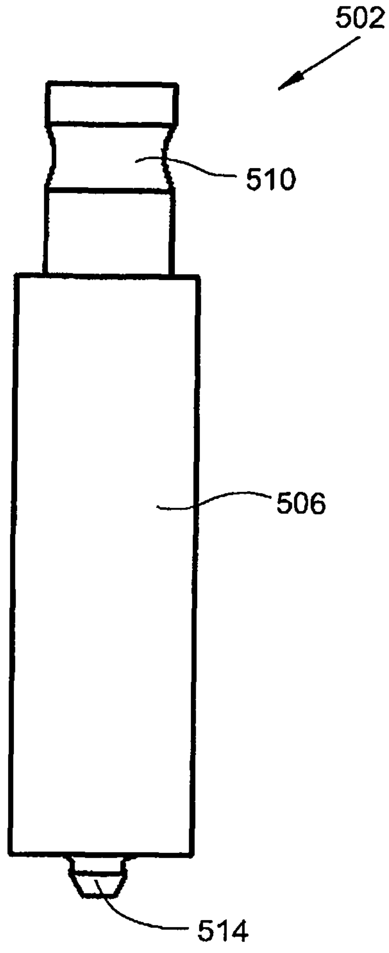

FIG. 5*a* shows the first part 501 of a tool and FIG. 5*b* shows the second part 502 of the same tool that is intended to effect the crimping of a connection assembly 100, 300, 400 according to the disclosure.

The first part 501 comprises a cylindrical body 504 that carries, at one of its ends, a shoe 508 intended to be fixed in the jaw of a machine and, at the other end, a hollow recess 512.

The second part 502 comprises a cylindrical body 506 that carries, at one of its ends, a shoe 510 intended to be fixed in the jaw of the machine and, at the other end, a punch 514.

The recess 512 is disposed facing the punch 514 and the machine is designed to enable the first part 501 and the second part 502 to be brought closer together.

The column to be crimped is fitted on the body 504 of the first part 501, and the conductive plate and possibly the other small column are placed on the face carrying the recess 512. The punch 514 is then brought closer to the recess 512 and through its shape gives rise to a radial expansion of the column and then the axial compression thereof.

The punch 514 is fixed to the body 506 by means of a grooved zone 516 which, by moving closer to the recess 512, obliges the end of the small column to move away radially. The end of the body 506 then compresses the free end thus moved away.

The fitting of one or two columns makes it possible to manage the problems of distance with the electrical components and the specific crimping by radial expansion guarantees good mechanical strength and good electrical contact of each small column on the conductive plate.

The dimensions of the various elements are such that, after crimping, no translation movement is possible between them.

Although the disclosure has been described in detail with reference to certain preferred embodiments, variations and modifications exist within the spirit and scope of the disclosure as described and defined in the following claims.

The invention claimed is:

1. An electrical connection assembly comprising:

a conductive plate with a drill hole in the conductive plate, a first column with a first hole, passing axially through the first column and comprising a shoulder coming into abutment against a face of the conductive plate and a hollow cylinder having a length and a radius sized to enable the hollow cylinder to enter the drill hole, and a second column with a second hole, passing axially through the second column and comprising a shoulder coming into abutment against another face of the conductive plate, a first cylinder with a radius sized to enable the first cylinder to enter the first hole in the first column and a length sized such that, when the shoulder of the second column is in abutment with the conductive plate, a free end of the first cylinder projects beyond an external face of the first column, and a second cylinder having a length and a radius sized to enable the second cylinder to enter the drill hole, wherein the free end of the first cylinder is crimped in the first hole in the first column, and wherein the lengths are sized such that, when the shoulder of the first column and the shoulder of the second column are in abutment against the conductive plate, the hollow cylinder and the second cylinder are in abutment against each other inside the drill hole.

2. The electrical connection assembly according to claim 1, wherein the hole in the first column is bevelled on a crimping side.

3. An electrical connection assembly comprising:

a conductive plate having a thickness and a drill hole in the conductive plate, a first column with a first hole passing axially through the first column and comprising a shoulder coming into abutment against a face of the conductive plate, the shoulder having a second hole passing axially through the shoulder, and a second column with a hole passing axially through the second column and comprising a shoulder coming into abutment against another face of the conductive plate, a first cylinder with a radius sized to enable the first cylinder to enter the first hole in the first column and a length sized such that, when the shoulder of the second column is in abutment with the conductive plate, a free end of the first cylinder projects beyond an external face of the first column, and a second cylinder having a radius sized to enable the second cylinder to enter the drill hole and a length which is greater than the thickness of the conductive plate, wherein the free end of the first cylinder is crimped in the first hole in the first column, and wherein the shoulder of the second column has a radius sized to enable the second hole in the shoulder of the first column to be fitted on the second cylinder.

4. The electrical connection assembly according to claim 3, wherein the hole in the first column is bevelled on a crimping side.

* * * * *